(12) United States Patent
Kim

(10) Patent No.: US 6,927,467 B2
(45) Date of Patent: Aug. 9, 2005

(54) MAGNETORESISTIVE MEMORY DEVICE AND METHOD FOR FABRICATING THE SAME

(75) Inventor: Hyeong-Jun Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/636,027

(22) Filed: Aug. 6, 2003

(65) Prior Publication Data

US 2004/0061166 A1 Apr. 1, 2004

(30) Foreign Application Priority Data

Sep. 19, 2002 (KR) ................................ 10-2002-0057189

(51) Int. Cl.[7] .......................... H01L 29/82; G11C 11/00
(52) U.S. Cl. ...................... 257/421; 257/422; 257/760; 257/900; 365/158; 365/171
(58) Field of Search ................................ 257/421, 422, 257/427, 632, 295, 296, 758, 760, 900; 365/158, 171

(56) References Cited

U.S. PATENT DOCUMENTS 5,902,690 A * 5/1999 Tracy et al. ................ 428/693

6,473,328 B1 * 10/2002 Mercaldi .................... 365/130
6,504,197 B2 * 1/2003 Minakata et al. ........... 257/295
2004/0061166 A1 * 4/2004 Kim .......................... 257/314

FOREIGN PATENT DOCUMENTS

JP 11-238377 8/1999
KR 2001-0100862 11/2001

OTHER PUBLICATIONS

English Language of Abstract for Korean Patent Publication No. 11–238377, Aug. 1999.

English Language of Abstract from PCT application for Korean Patent Publication No. 2001–0100862, Nov. 2001.

* cited by examiner

*Primary Examiner*—Mark V. Prenty
(74) *Attorney, Agent, or Firm*—Marger Johnson & McCollom, P.C.

(57) ABSTRACT

Embodiments of the invention include magnetoresistive memory cells having magnetic focusing spacers are formed on sidewalls thereof. Therefore, magnetic fields generated by a bit line and a digit line are focused by the magnetic focusing spacers and efficiently transferred to the magnetoresistive memory cell. In addition, an interlayer dielectric layer surrounding the magnetoresistive memory cell may be formed of high permeability material, thereby efficiently transferring magnetic field.

19 Claims, 17 Drawing Sheets

US 6,927,467 B2

MAGNETORESISTIVE MEMORY DEVICE AND METHOD FOR FABRICATING THE SAME

CROSS REFERENCE TO RELATED APPLICATIONS

This application claims priority from Korean Patent Application No. 2002-57189, filed on Sep. 19, 2002, the contents of which are hereby incorporated by reference in their entirety.

BACKGROUND OF THE INVENTION

1. Technical Field of the Invention

This disclosure relates to a semiconductor memory device and more specifically to a magnetoresistive memory device and method of fabricating the same.

2. Description of the Related Art

A magnetoresistive random access memory (MRAM) includes ferromagnetic layers isolated by a nonmagnetic layer. Data is stored in the MRAM according to a direction of the magnetization vectors. For example, the magnetization vector of one ferromagnetic layer may be fixed or locked by a magnetic field, but the magnetization vector of another ferromagnetic layer may be free to vary depending on the applied magnetic field. Therefore, depending on the relative directions of the magnetization vectors, binary data can be stored. That is, when the magnetization vectors of the ferromagnetic layers are in the same direction (e.g., in a parallel state), the resistance of the MRAM has a minimum value. Conversely, when the magnetization vectors are in opposite direction (e.g., in an anti-parallel state), the resistance of the MRAM has a maximum value. Therefore, the resistance of the ferromagnetic layer is sensed by a sensing current in order to read out data stored in the magnetoresistive memory cell.

Accordingly, to achieve low power dissipation, the magnetic field that changes the direction of the magnetization vector should be efficiently transferred to the magnetoresistive memory cell.

Embodiments of the invention address this and other aspects of the conventional art.

SUMMARY OF THE INVENTION

Embodiments of the invention provide magnetoresistive memory devices enabling a device to operate with low power and a method of fabricating the same.

DETAILED DESCRIPTION OF THE INVENTION

The invention will now be described more fully hereinafter with reference to the accompanying drawings, in which exemplary embodiments of the invention are shown. Like numbers refer to like elements throughout the specification.

Figure 1:
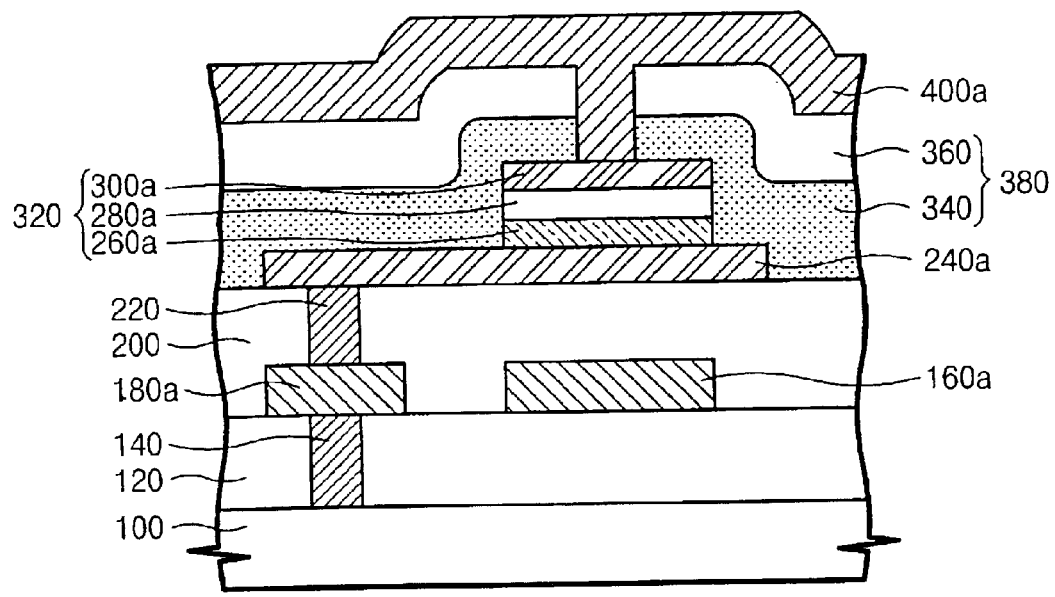
FIG. 1 is a schematic cross-sectional diagram of a magnetoresistive memory device according to an embodiment of the invention.

FIG. 1 is a schematic cross-sectional diagram of a magnetoresistive memory device in accordance with an embodiment of the invention. Referring to FIG. 1, the magnetoresistive memory device includes a conductive pattern 240a, a magnetoresistive memory cell 320 that is stacked on the conductive pattern 240a, and an interlayer dielectric layer 380 surrounding the magnetoresistive memory cell 320. The magnetoresistive memory cell 320 includes two ferromagnetic layer patterns 260a and 300a with a nonmagnetic layer pattern 280a interposed therebetween.

The interlayer dielectric layer 380 includes a magnetic material layer 340 with high permeability. For example, the magnetic material layer 340 is formed of Ni—Zn-Ferrite, Mn—Zn-Ferrite, MnFeO, CuFeO, FeO, NiFeO, or a combination thereof. By using these materials with high permeability, magnetic fields generated by a bit line and a digit line are efficiently transferred to the magnetoresistive memory cell 320.

In addition, the interlayer dielectric layer 380 may include a silicon oxide layer 360. That is, a high permeability magnetic layer 340 and a silicon oxide layer 360 are sequentially stacked to form the interlayer dielectric layer 380. It is apparent to those skilled in the art that those layers may be alternately stacked. In other embodiments, the interlayer dielectric layer 380 may be formed only with a magnetic material layer.

A bit line 400a is disposed on the interlayer dielectric layer 380 to electrically connect with the magnetoresistive memory cell 320 at the upper ferromagnetic layer pattern 300a.

The conductive pattern 240a is electrically connected to an active region of a substrate through a predetermined hole in insulation layers 200 and 120. That is, the conductive pattern 240a is electrically connected to the active region of the substrate 100 through a lower contact plug 140 formed in the insulation layer 120 to electrically connect with the active region of the substrate 100, a contact pad 180a disposed on the insulation layer 120 to electrically connect with the lower contact plug 140, and an upper contact plug 220 formed in the insulation layer 200 to electrically connect with the contact pad 180a.

A digit line 160a is disposed on the insulation layer 120 to align with a bottom of the magnetoresistive memory cell 320. The digit line 160a and the bit line 400a cross over each other and the magnetoresistive memory cell 320 is disposed in the intersection region by the digit line 160a and bit line 400a.

A magnetic field generated by the bit line 400a and the digit line 160a is transferred to the magnetoresistive memory cell 320. In this case, the interlayer dielectric layer 380 is formed of a high permeability material, so that the generated magnetic field is efficiently transferred to the magnetoresistive memory cell 320. This corresponds to a writing operation of the magnetoresistive memory device.

Meanwhile, a sense current flows through a conductive path between the bit line 400a and the active region of the substrate 100, thereby reading out data stored in the magnetoresistive memory cell 320. This corresponds to a reading operation of the magnetoresistive memory device.

Although not illustrated the drawings, a switch (e.g., a transistor) may also be disposed on the substrate 100 to control the current between the bit line 400a and the substrate 100.

During the writing operation, the transistor is turned off to interrupt the current path between the bit line 400a and the substrate 100, and a magnetic field generated by the current flowing through the bit line 400a may be transferred to the magnetoresistive memory cell 320.

Figure 2:
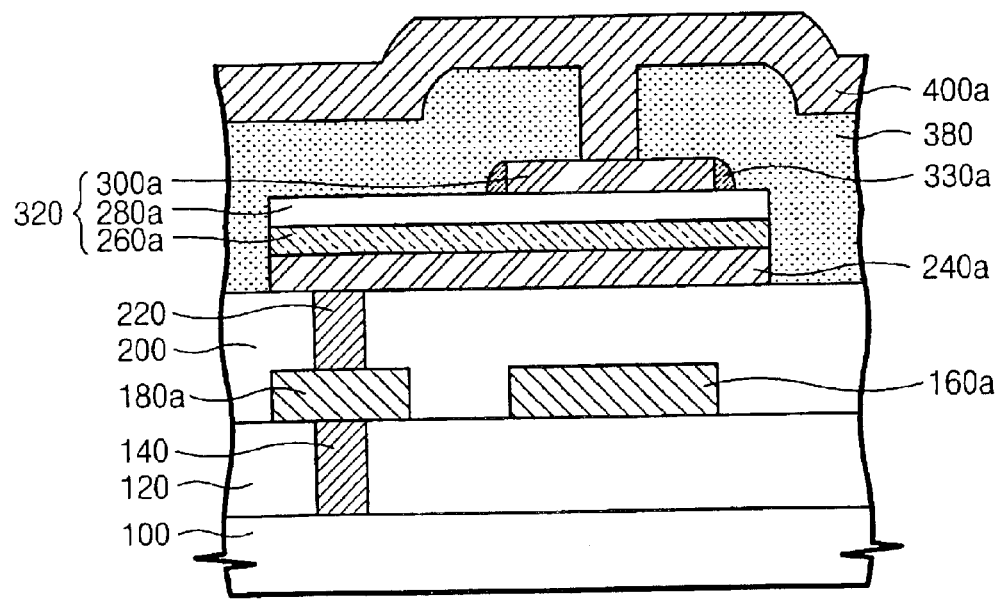
FIG. 2 is a schematic cross-sectional diagram of a magnetoresistive memory device according to another embodiment of the invention.

FIG. 2 is a schematic cross-sectional diagram of a magnetoresistive memory device in accordance with another embodiment of the invention. Referring to FIG. 2, the magnetoresistive memory device includes a conductive pattern 240a, a magnetoresistive memory cell 320 stacked on the conductive pattern 240a, and an interlayer dielectric layer 380 surrounding the magnetoresistive memory cell 320. The magnetoresistive memory cell 320 includes a lower ferromagnetic layer pattern 260a, a nonmagnetic layer pattern 280a and an upper ferromagnetic layer pattern 300a, which are sequentially disposed on the conductive pattern 240a.

In this embodiment, the magnetoresistive memory device includes magnetic focusing spacers 330a disposed on sidewalls of the upper ferromagnetic layer pattern 300a. Generally speaking, focusing spacers may be disposed on sidewalls of any ferromagnetic layer where the magnetization vector varies depending on the applied magnetic field. In this case, the magnetization vector varies in the upper ferromagnetic layer pattern 300a. In addition, the conductive pattern 240a, the lower ferroelectric pattern 260a, and the nonmagnetic layer pattern 280a are substantially identical in size but are larger than the upper ferromagnetic layer pattern 300a.

The conductive pattern 240a is electrically connected to an active region of the substrate 100 in an identical fashion as the one previously explained for the magnetoresistive memory device of FIG. 1.

A bit line 400a is disposed on the interlayer dielectric layer 380a and is electrically connected to the upper ferromagnetic layer pattern 300a. A digit line 160a is disposed on the insulation layer 200 and runs perpendicularly to the bit line 400a. The upper ferromagnetic layer pattern 300a is positioned in an intersection region by the bit line 400a and the digit line 160a.

The magnetic focusing spacers 330a are formed of a conductive layer such as Co, NiFe, or a combination thereof. Alternatively, the magnetic focusing spacers may be formed of a nonconductive layer such as Ni—Zn-Ferrite, Mn—Zn-Ferrite, MnFeO, CuFeO, FeO, NiFeO, or a combination thereof.

In this embodiment, the interlayer dielectric layer 380 may be formed of a single layer of silicon oxide due to the magnetic focusing spacers 330a. Alternatively, the interlayer dielectric layer 380 may be formed from multiple alternating layers of high permeability magnetic material and silicon oxide, like the magnetoresistive memory device of FIG. 1.

Figure 3:
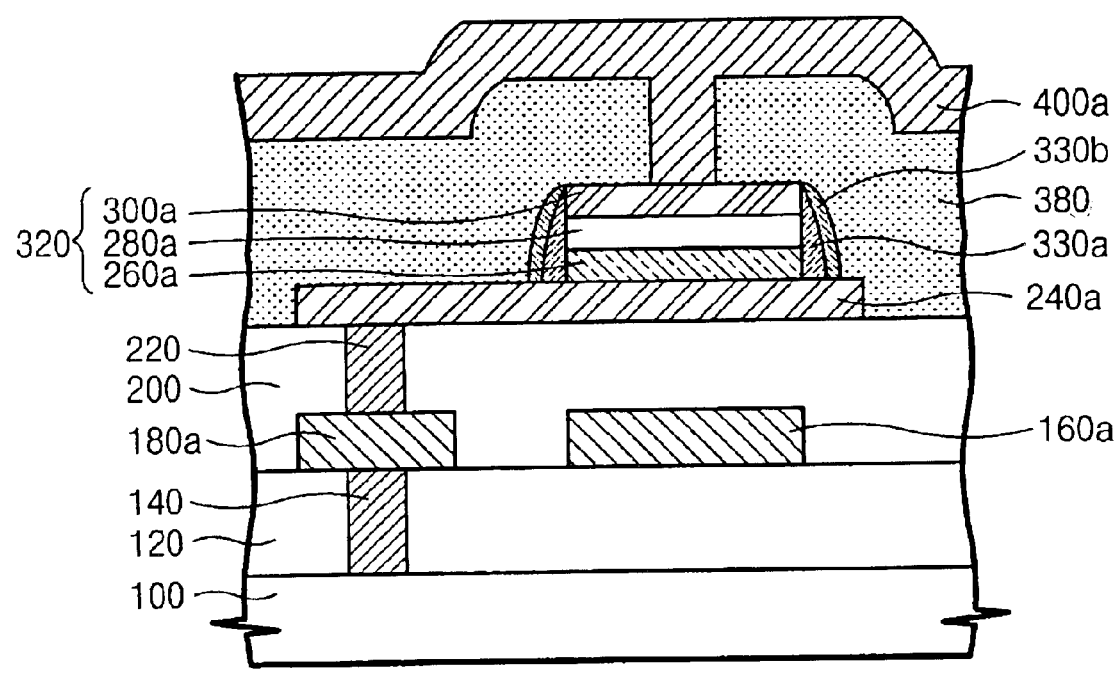
FIG. 3 is a schematic cross-sectional diagram of a magnetoresistive memory device according to still another embodiment of the invention.

FIG. 3 is a schematic cross-sectional diagram of a magnetoresistive memory device in accordance with still another embodiment of the invention.

In this embodiment, compared to the the magnetoresistive memory device of FIG. 2, this device includes more magnetic focusing spacers on the sidewalls of the magnetoresistive memory cell 320.

That is to say, referring to FIG. 3, nonconductive magnetic focusing spacers 330a and conductive magnetic focusing spacers 330b are disposed on sidewalls of the entire magnetoresistive memory cell 320 that includes a lower ferromagnetic layer pattern 260a, a nonmagnetic layer pattern 280a and an upper ferromagnetic layer pattern 300a. The nonconductive magnetic focusing spacers 330a are formed of Ni—Zn-Ferrite, Mn—Zn-Ferrite, MnFeO, CuFeO, NiFeO, or a combination thereof. The conductive magnetic focusing spacers 330b are made of a metallic magnetic material such as Co, NiFe, or a combination thereof. In this case, the interlayer dielectric layer 380 may be formed of a single layer of silicon oxide.

A method of fabricating the magnetoresistive memory device will be explained hereinafter.

FIGS. 4A–4H are cross-sectional diagrams showing an example method of fabricating the magnetoresistive memory device of FIG. 1. First, referring to FIG. 4A, a lower insulation layer 120 is formed on a substrate 100. Before forming the lower insulation layer 120, a transistor (not shown) is formed by a conventional MOSFET process. A digit line 160a is formed on the lower insulation layer 120 to supply a magnetic field to the magnetoresistive memory cell. A contact pad 180a is also formed that electrically connects to the active region of the substrate 100 through a contact plug 140 penetrating the lower insulation layer 120.

Figure 4A:
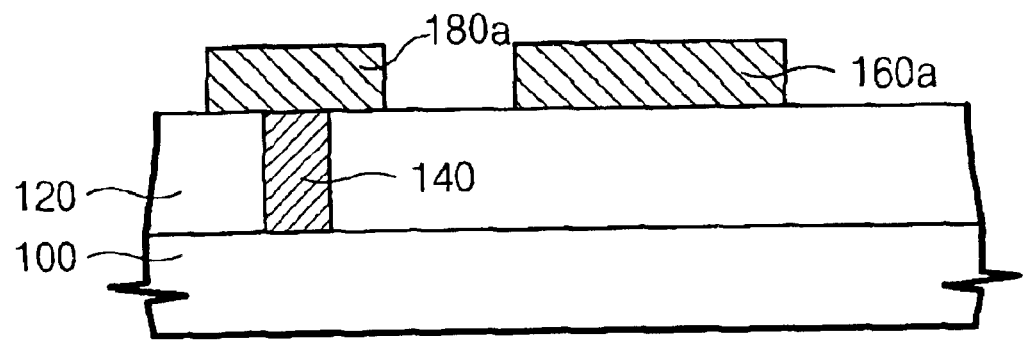
FIGS. 4A–4H are cross-sectional diagrams showing a method of fabricating the magnetoresistive memory device of FIG. 1 according to an embodiment of the invention.
Figure 4B:
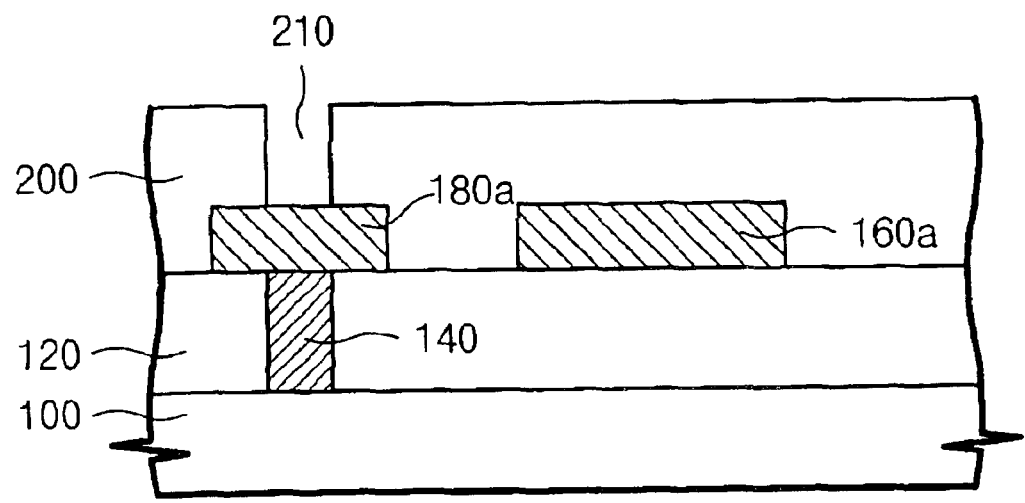

Referring to FIG. 4B, an upper insulation layer 200 is formed to insulate the digit line 160a and the contact pad 180a. The upper insulation layer 200 is patterned to form a contact hole 210 exposing the contact pad 180a.

Figure 4C:
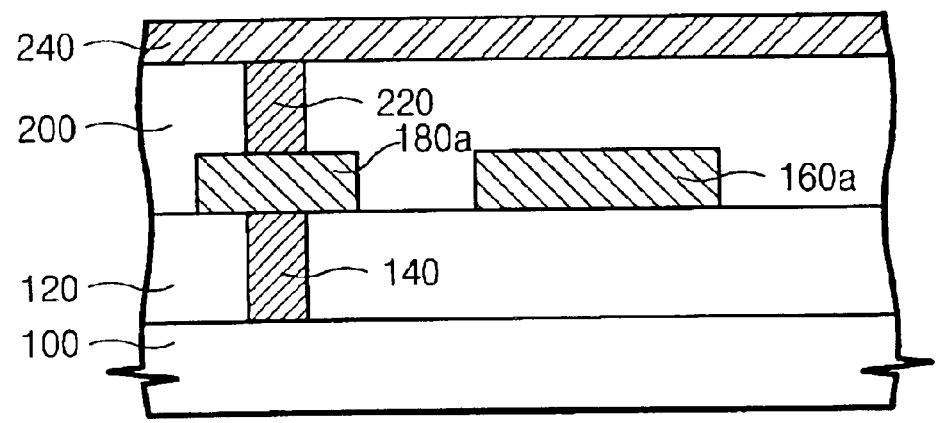

Referring to FIG. 4C, a conductive material is formed on the upper insulation layer 200 so as to fill the contact hole 210 and then etched to planarize the conductive material and form an upper contact plug 220.

Figure 4D:
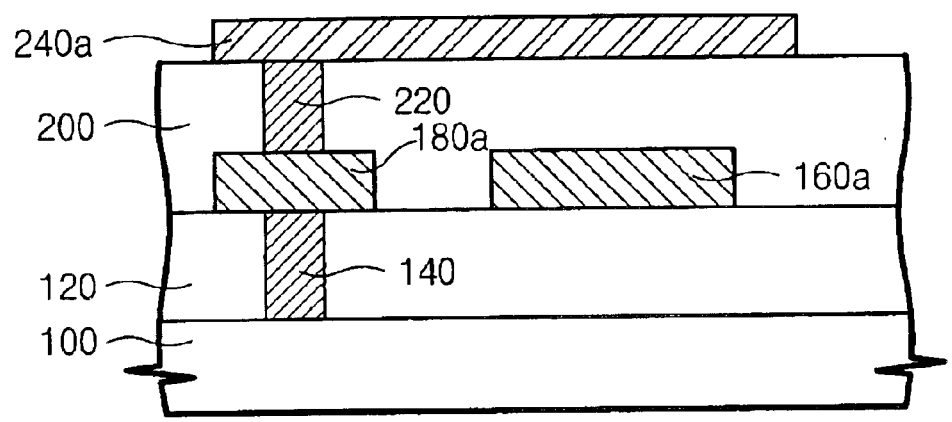

A conductive layer 240 is formed on the contact plug 220 and the upper insulation layer 200. In alternative embodiments, the conductive layer 240 may be formed of multiple layers of titanium and tantalum. Referring to FIG. 4D, the conductive layer 240 is patterned to form a conductive pattern 240a. The conductive pattern 240a electrically connects with the upper contact plug 220 and covers the contact pad 180a and the digit line 160a.

Figure 4E:
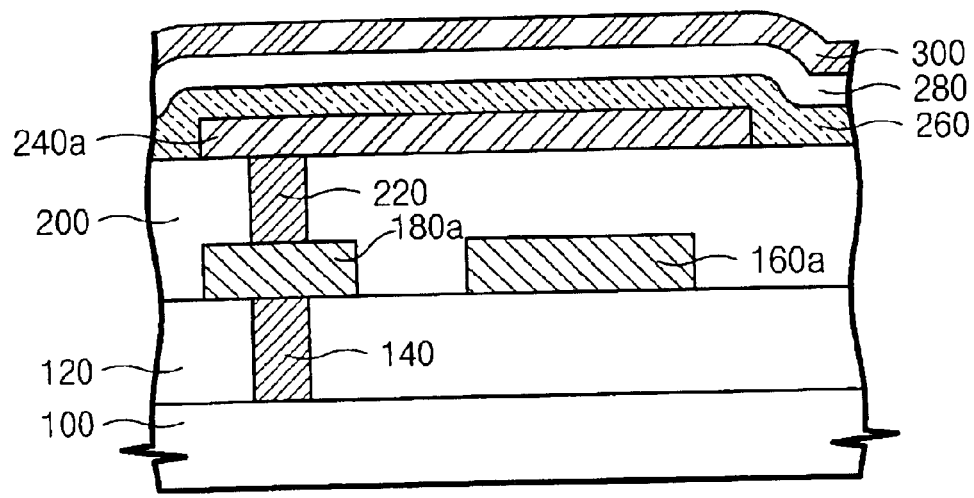

Referring to FIG. 4E, a lower ferromagnetic layer 260, a nonmagnetic layer 280, and an upper ferromagnetic layer 300 are sequentially formed on the upper insulation layer 200 and the conductive pattern 240a. In this case, the lower ferromagnetic layer 260 is formed of a material where the magnetization direction is fixed, and the upper ferromagnetic layer 300 is formed of a material where the magnetization direction varies depending on the applied magnetic field. The nonmagnetic layer 280 is formed of a material where an electric carrier can tunnel when a sense voltage is applied to the ferromagnetic layers 260 and 300.

Figure 4F:
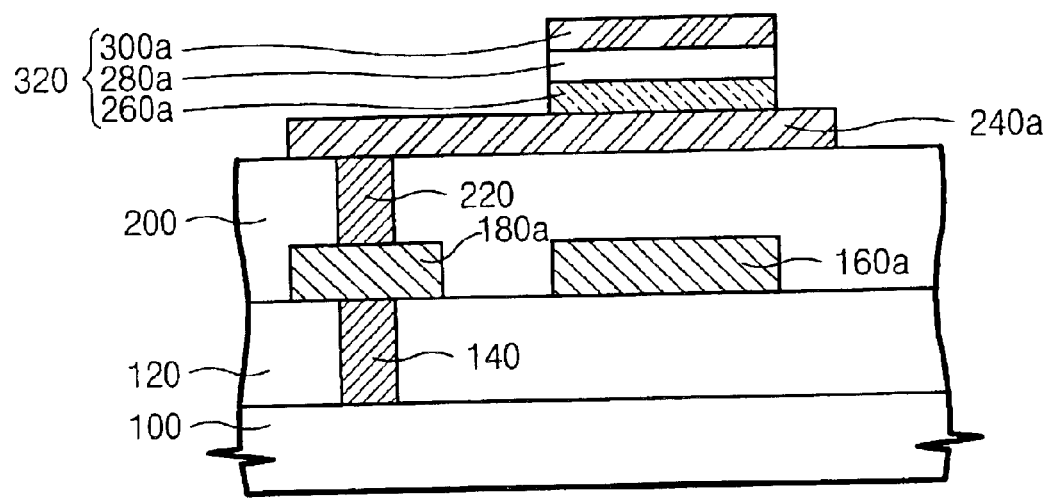

The upper ferromagnetic layer 300, the nonmagnetic layer 280, and the lower ferromagnetic layer 260 are patterned to form a magnetoresistive memory cell 320 over the digit line 160a, as shown in FIG. 4F. The magnetoresistive memory cell 320 includes an upper ferromagnetic layer pattern 300a, a nonmagnetic layer pattern 280a, and a lower ferromagnetic layer pattern 260a.

Figure 4G:
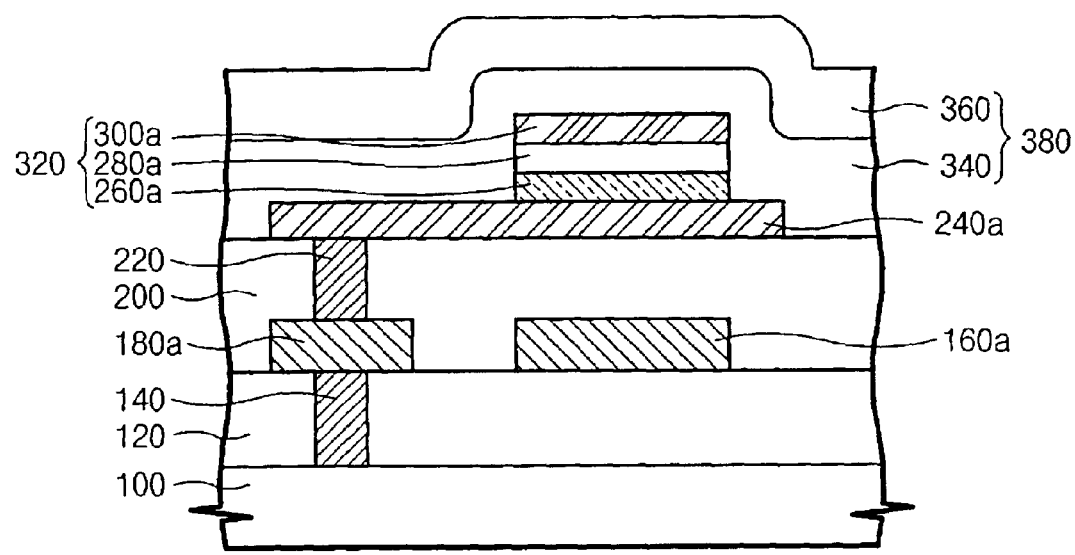

Referring to FIG. 4G, an interlayer dielectric layer 380 is formed to insulate the magnetic resistive memory cell 320.

The interlayer dielectric layer 380 of that figure is formed of a multi-layer including a high permeability magnetic layer 340 and a silicon oxide layer 360 that are sequentially stacked. The interlayer dielectric layer 380 may alternatively be formed of a single layer of magnetic material with high permeability such as Ni—Zn-Ferrite, Mn—Zn-Ferrite, MnFeO, CuFeO, FeO, NiFeO, or a combination thereof.

Figure 4H:
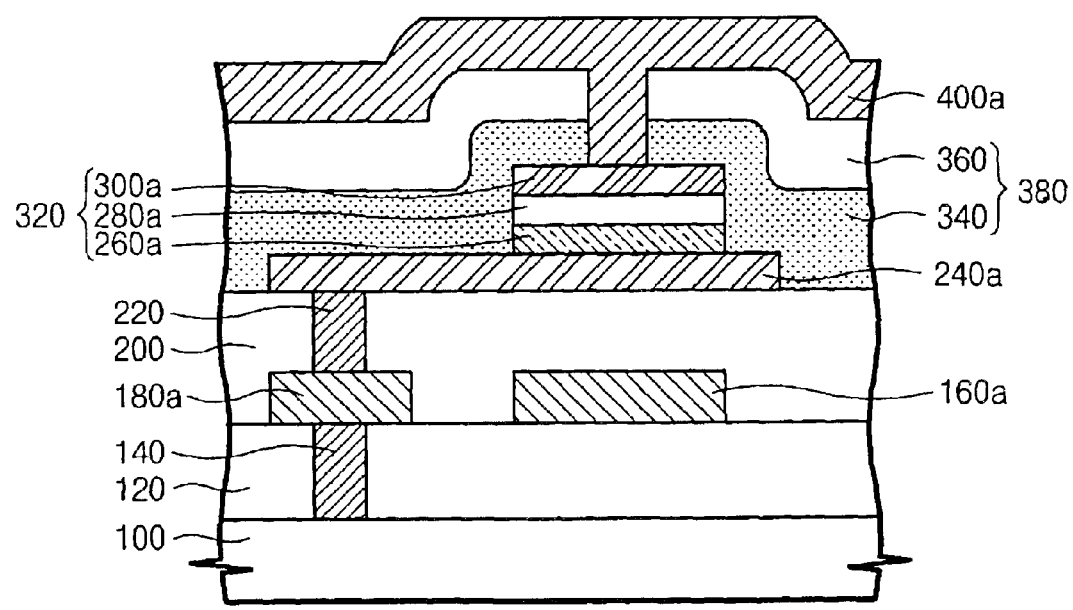

Referring to FIG. 4H, a bit line 400a is formed to electrically connect with the upper ferromagnetic layer pattern 300a through a predetermined part of the interlayer dielectric layer 380. More specifically, the interlayer dielectric layer 380 is patterned to form a contact hole exposing the upper ferromagnetic layer pattern 300a. Then, a bit line conductive layer is formed and patterned to form the bit line 400a.

In the method described above, the magnetoresistive memory cell 320 is formed after forming the conductive pattern 240a. Alternatively, the magnetoresistive memory cell 320 may be formed concurrently with the conductive pattern 240a. That is to say, referring to FIG. 4C, the conductive layer 240 is formed on the upper insulation layer 200 and the upper contact plug 220, followed by formation of the lower ferroelectric layer 260, the nonmagnetic layer 280, and the upper ferromagnetic layer 300. Next, the stacked material layers are successively patterned to form the magnetoresistive memory cell 320 and the conductive pattern 240a of FIG. 4.

Referring to FIGS. 5A–5G, a method of fabricating the magnetoresistive memory device of FIG. 2 will be explained in accordance with an embodiment of the invention.

Figure 5A:
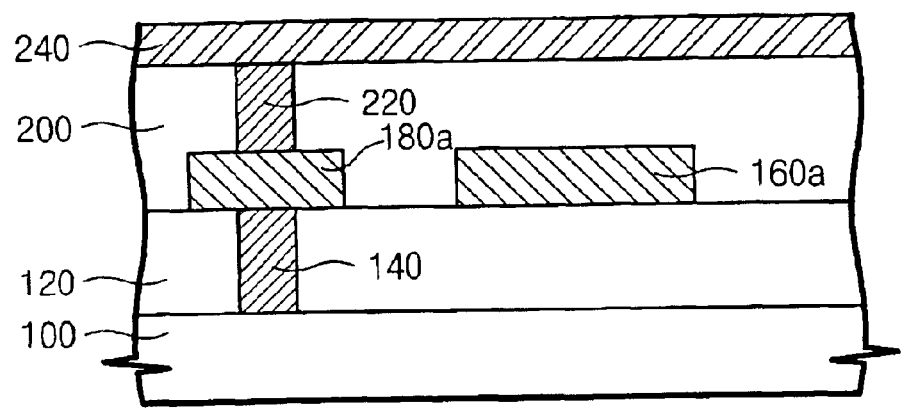
FIGS. 5A–5G are cross-sectional diagrams showing a method of fabricating the magnetoresistive memory device of FIG. 2 according to another embodiment of the invention.

Referring to FIG. 5A, a digit line 160a, a contact pad 180a, contact plugs 140 and 220, an insulation layer 120 and 200, and a conductive layer 240 are formed by methods identical to those explained above for FIGS. 4A–4C.

Figure 5B:
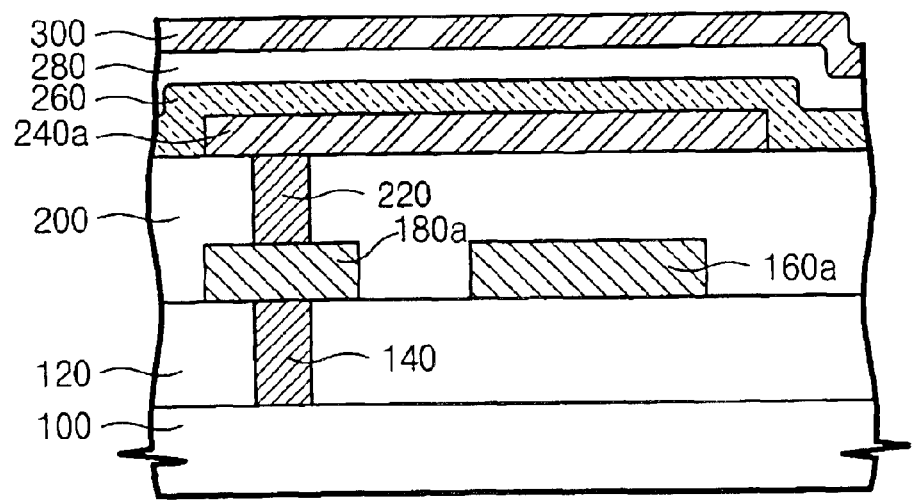

Referring to FIG. 5B, the conductive layer 240 is patterned to form a conductive pattern 240a. The conductive pattern 240a electrically connects with the upper contact plug 220 and lies over the contact pad 180a and the digit line 160a. A lower ferromagnetic layer 260, a nonmagnetic layer 280, and an upper ferromagnetic layer 300 are sequentially formed on the conductive pattern 240a.

Figure 5C:
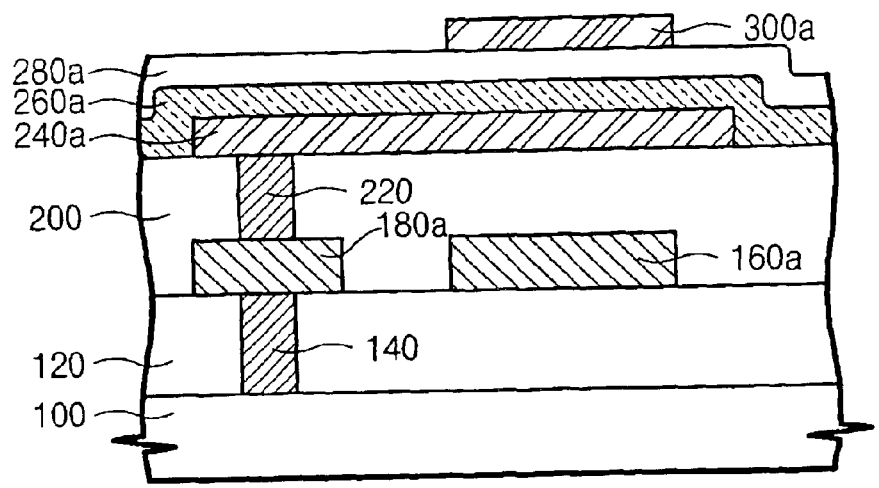

Referring to FIG. 5C, the upper ferromagnetic layer 300 is patterned to form an upper ferromagnetic layer pattern 300a that lies over the digit line 160a.

Figure 5D:
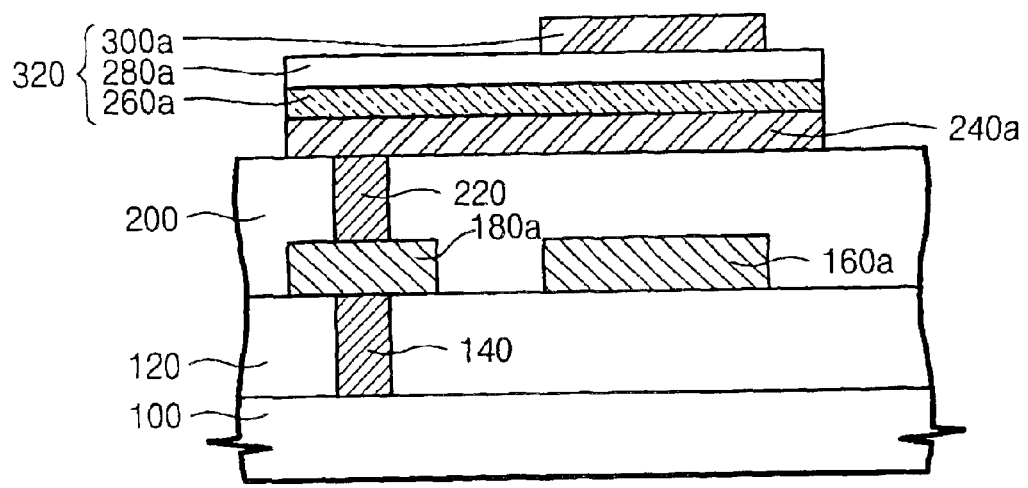

Referring to FIG. 5D, the nonmagnetic layer 280 and the lower ferromagnetic layer 260 are successively patterned to form a nonmagnetic layer pattern 280a and a lower ferromagnetic layer pattern 260a. The nonmagnetic layer pattern 280a and the lower ferromagnetic layer pattern 260a are wider than the upper ferromagnetic layer pattern 300a. Therefore, a magnetoresistive memory cell 320 is formed that includes the upper ferromagnetic layer pattern 300a, the nonmagnetic layer pattern 280a, and the lower ferromagnetic layer pattern 260a.

Figure 5E:
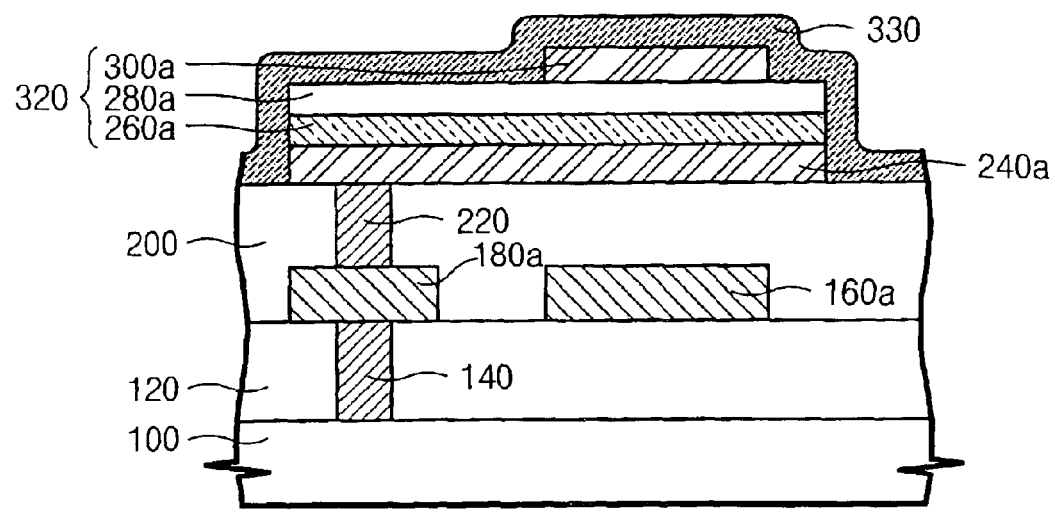

Referring to FIG. 5E, a spacer layer 330 is formed on the upper insulation layer 200, the nonmagnetic layer pattern 280a, and the upper ferromagnetic layer pattern 300a. The spacer layer 330 is formed of a metallic magnetic material such as Co, NiFe or a combination thereof. Alternatively the spacer layer 330 may be formed of a magnetic material with high permeability such as Ni—Zn-Ferrite, Mn—Zn-Ferrite, MnFeO, CuFeO, FeO, NiFeO, or a combination thereof.

Figure 5F:
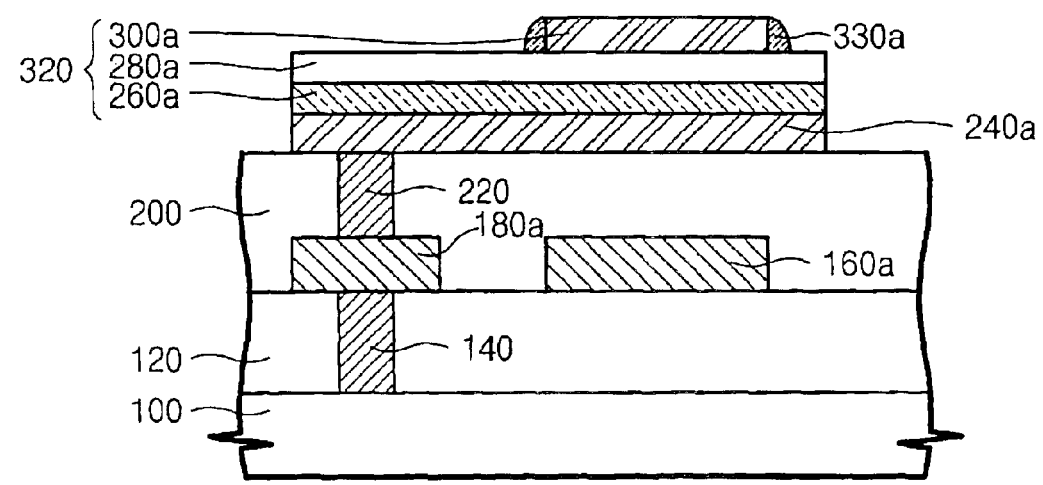

Referring to FIG. 5F, the spacer layer 330 is etched back to form magnetic focusing spacers 330a on sidewalls of the upper ferromagnetic layer pattern 300a.

Figure 5G:
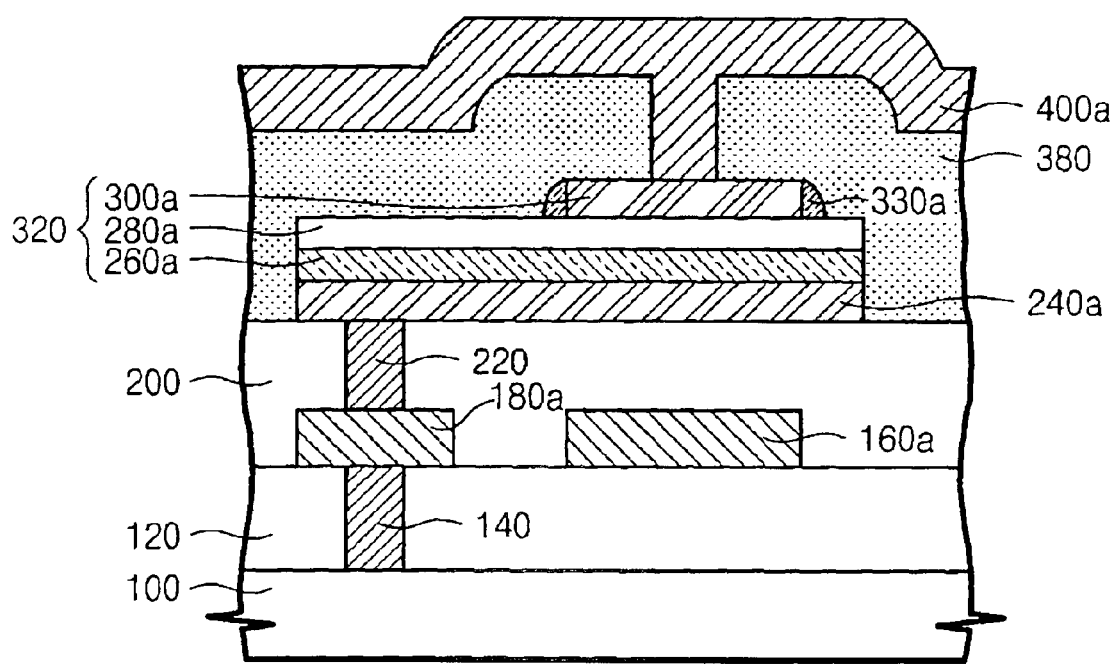

Referring to FIG. 5G, an interlayer dielectric layer 380 is formed to insulate the upper ferromagnetic layer pattern 300a, the nonmagnetic layer pattern 280a, the lower ferromagnetic layer pattern 260a, and the conductive pattern 240a. The interlayer dielectric layer 380 may be formed of silicon oxide, a high permeability magnetic layer, or a combination thereof. A bit line 400a is formed on the interlayer dielectric layer 380 to electrically connect with the upper ferromagnetic layer pattern 300a.

A method of fabricating the magnetoresistive memory device of FIG. 2 according to yet another embodiment of the invention will be explained with reference to FIG. 6A-6G. An explanation of processes that are identical to those previously discussed will be omitted.

Figure 6A:
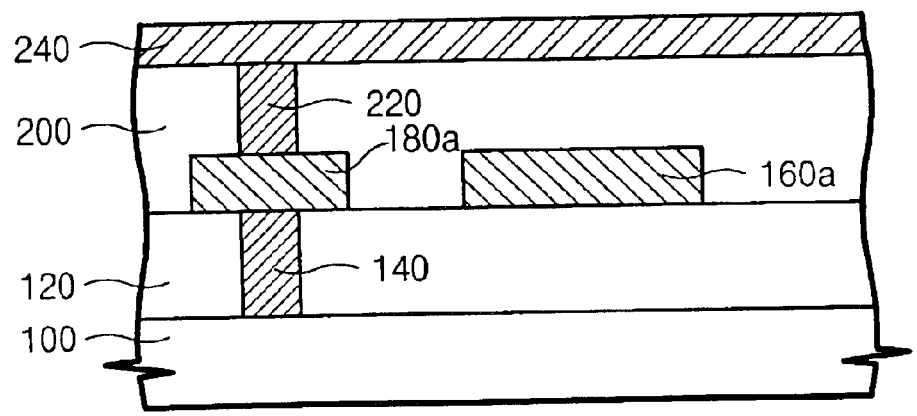
FIGS. 6A–6G are cross-sectional diagrams showing a method of fabricating the magnetoresistive memory device of FIG. 2 in accordance with yet another embodiment of the invention.

Referring to FIG. 6A, a digit line 160a, a contact pad 180a, contact plugs 140 and 220, insulation layer 120 and 200, and a conductive layer 240 are formed on a substrate 100 using the methods previously explained above.

Figure 6B:
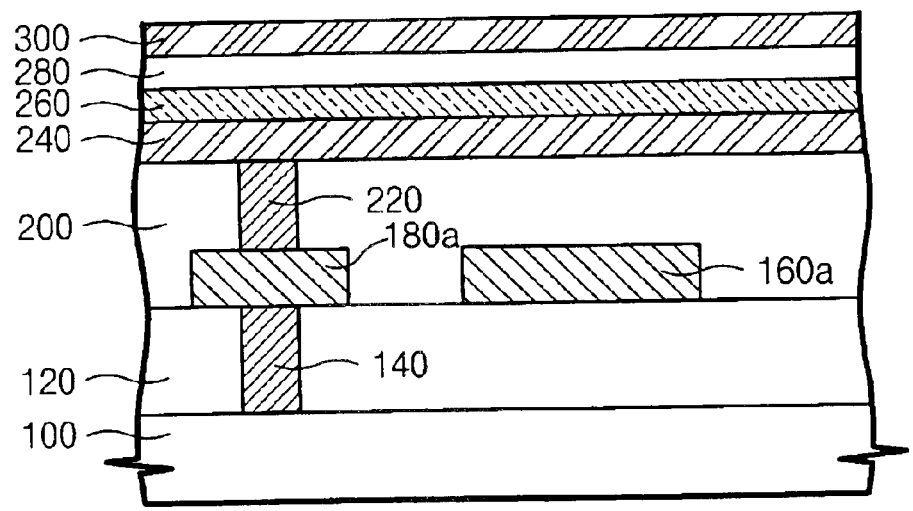
Figure 6C:
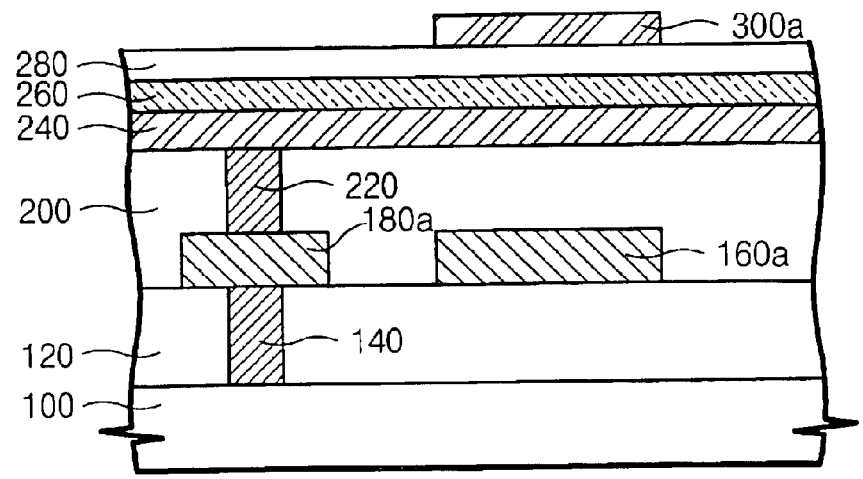

Referring to FIG. 6B, a lower ferromagnetic layer 260, a nonmagnetic layer 280, and an upper ferromagnetic layer 300 are sequentially formed on the conductive layer 240. Referring to FIG. 6C, the upper ferromagnetic layer 300 is patterned to form an upper ferromagnetic layer pattern 300a.

Figure 6D:
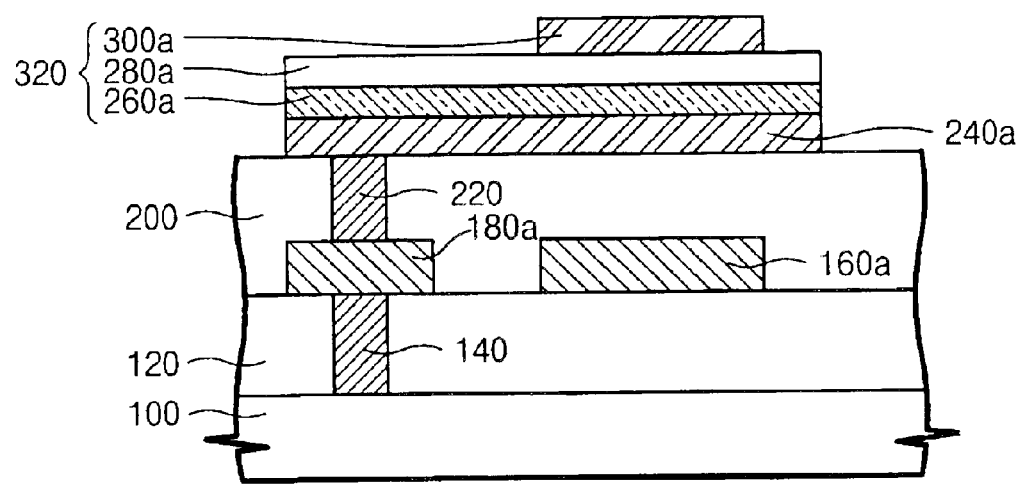

Referring to FIG. 6D, the nonmagnetic layer 280, the lower ferromagnetic layer 260, and the conductive layer 240 are successively patterned to form a nonmagnetic layer pattern 280a, a lower ferromagnetic layer pattern 260a, and a conductive layer pattern 240a.

Figure 6E:
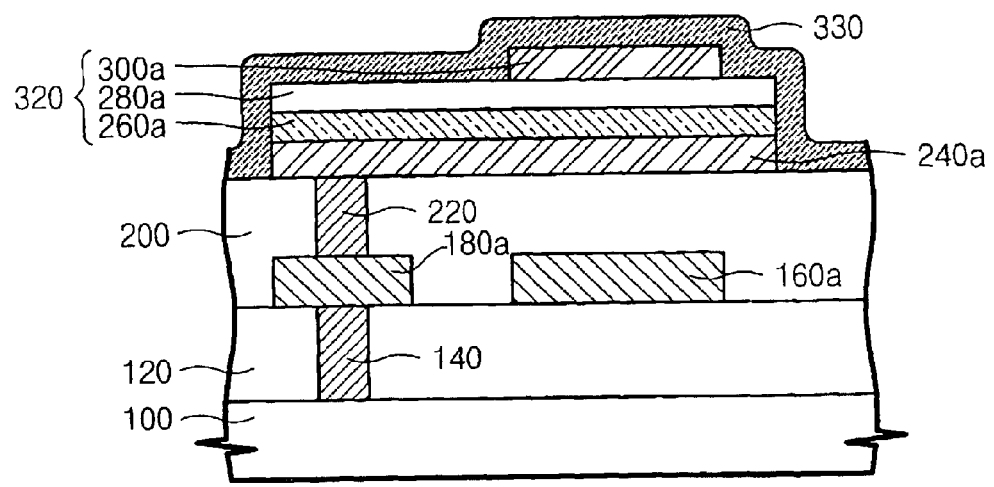
Figure 6F:
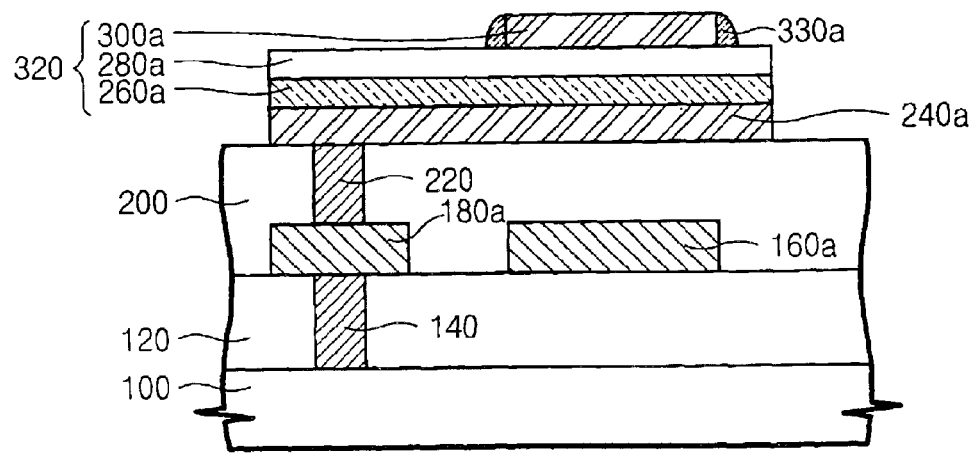

Referring to FIG. 6E, a spacer layer 330 is formed on the upper insulation layer 200 and the magnetoresistive memory cell 320. Next, the spacer layer 330 is etched back to form magnetic focusing spacers 330a on sidewalls of the upper ferromagnetic layer pattern 300a, as illustrated in FIG. 6F.

Figure 6G:
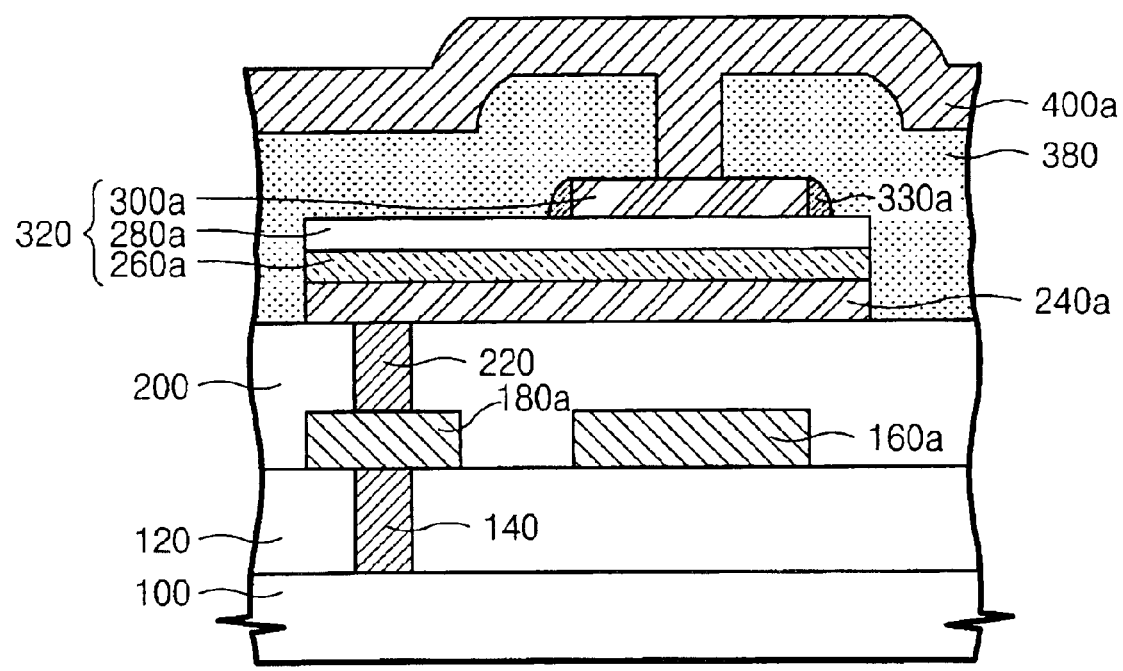

Referring to FIG. 6G, an interlayer dielectric layer 380 is formed on the resultant structure with the magnetic focusing spacers 330a. Continuously, a bit line 400 is formed on the interlayer dielectric layer 380 that is electrically connected to the upper ferromagnetic layer pattern 300a.

A method of fabricating the magnetoresistive memory device of FIG. 3 in accordance with another embodiment of the invention will be explained with reference to FIGS. 7A–7F. Redundant explanation of the processes included in the method will be omitted.

Figure 7A:
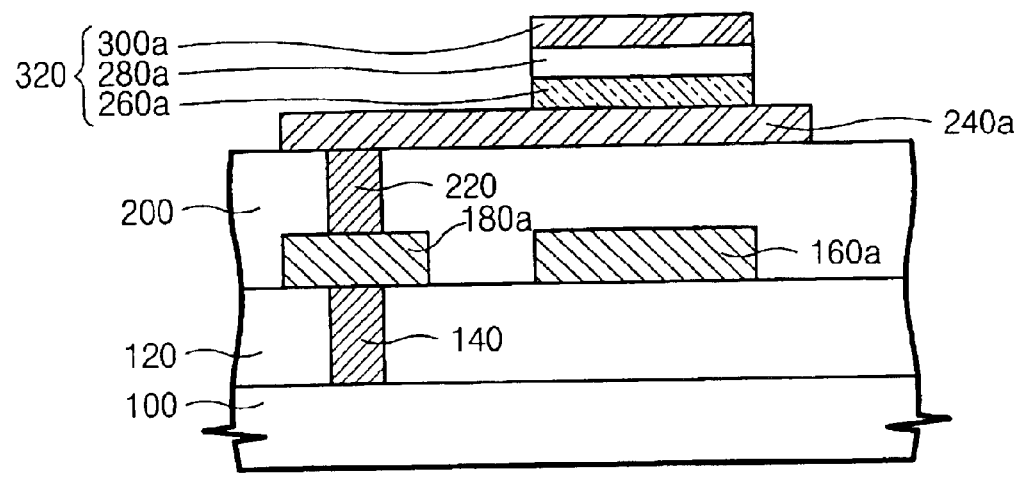
FIGS. 7A–7F are cross-sectional diagrams showing a method of fabricating the magnetoresistive memory device of FIG. 3 in accordance with another embodiment of the invention.

Referring to FIG. 7A, a magnetoresistive memory cell 320 is formed on the substrate 100 by processes identical to those illustrated by FIGS. 4A–4F. The magnetoresistive memory cell 320 includes a lower ferromagnetic layer pattern 260a, a nonmagnetic layer pattern 280a, and an upper ferromagnetic layer pattern 300a.

Figure 7B:
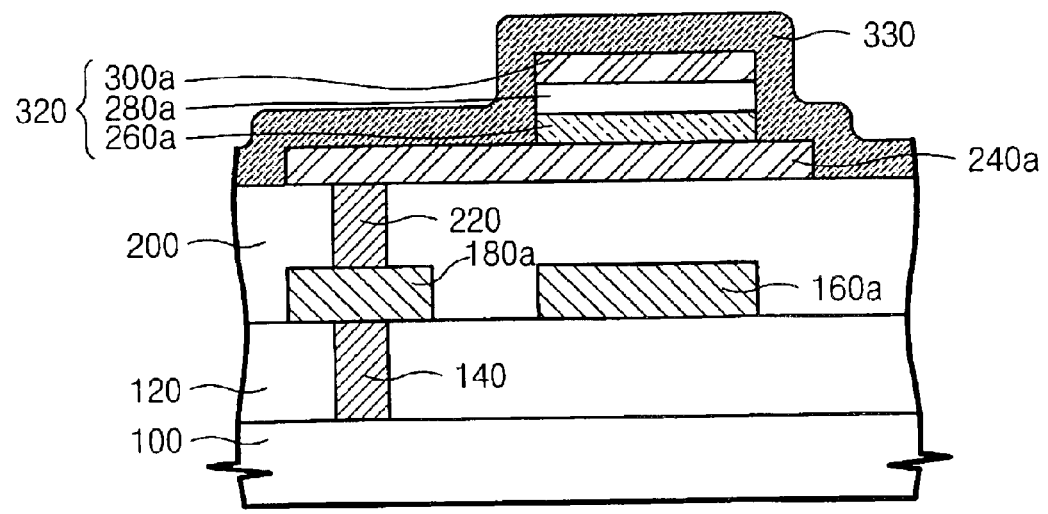

Referring to FIG. 7B, a spacer layer 330 is formed on an entire surface of the resultant structure that includes the magnetoresistive memory cell 320.

Figure 7C:
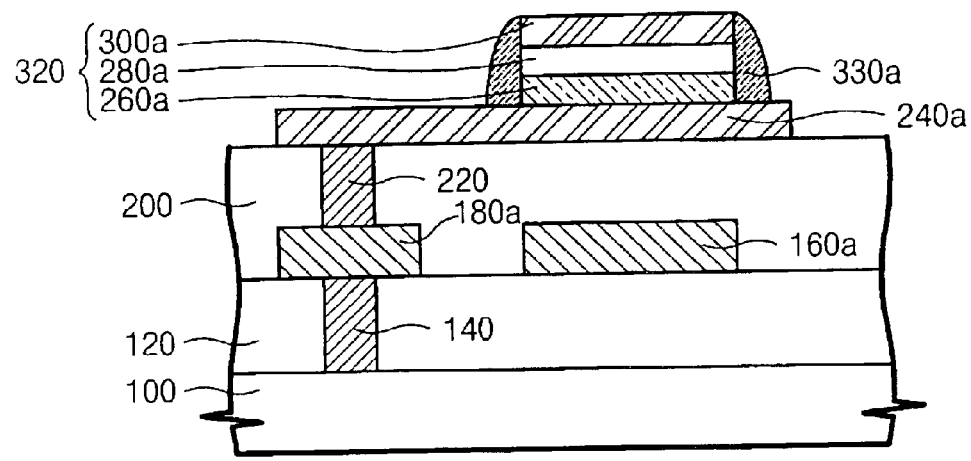

Referring to FIG. 7C, the spacer layer 330 is etched back to form nonconductive magnetic focusing spacers 330a on sidewalls of the magnetoresistive memory cell 320. The nonconductive magnetic focusing spacers 330a are formed of Ni—Zn-Ferrite, Mn—Zn-Ferrite, MnFeO, CuFeO, FeO, NiFeO, or a combination thereof.

Figure 7D:
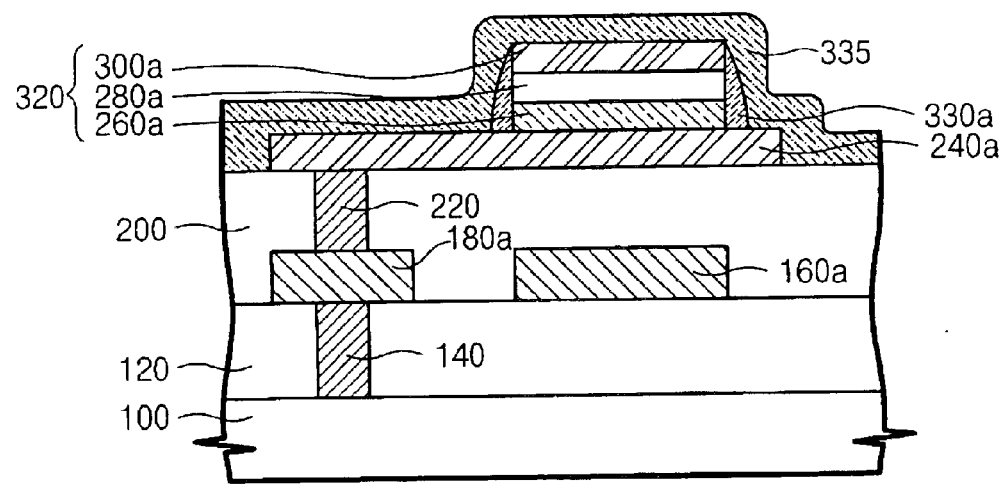

Referring to FIG. 7D, a conductive spacer layer 335 is formed on the resultant structure that includes the nonconductive magnetic focusing spacers 330a. The conductive spacer layer 335 is formed of metallic magnetic material such as Co, NiFe, or a combination thereof.

Figure 7E:
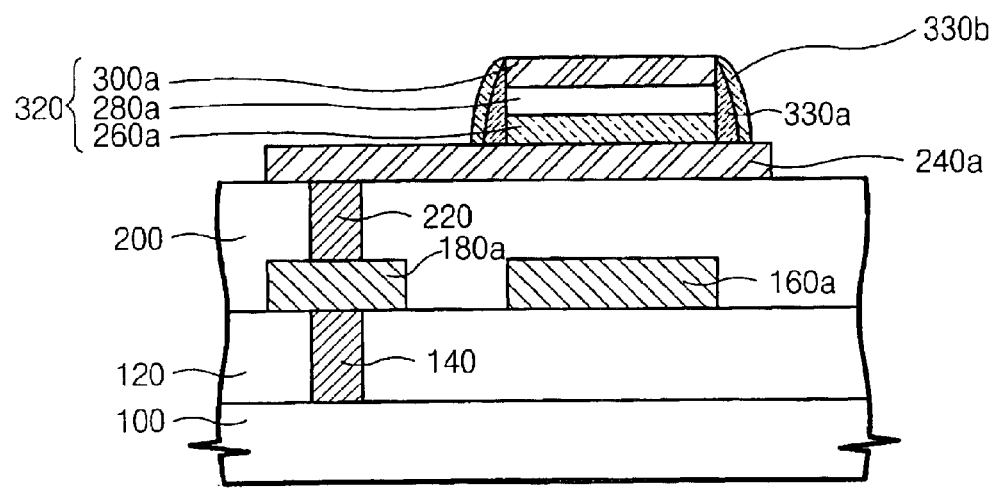

Referring to FIG. 7E, the conductive spacer layer 335 is etched back to form conductive magnetic focusing spacers 330b on the nonconductive magnetic focusing spacers 330a.

Figure 7F:
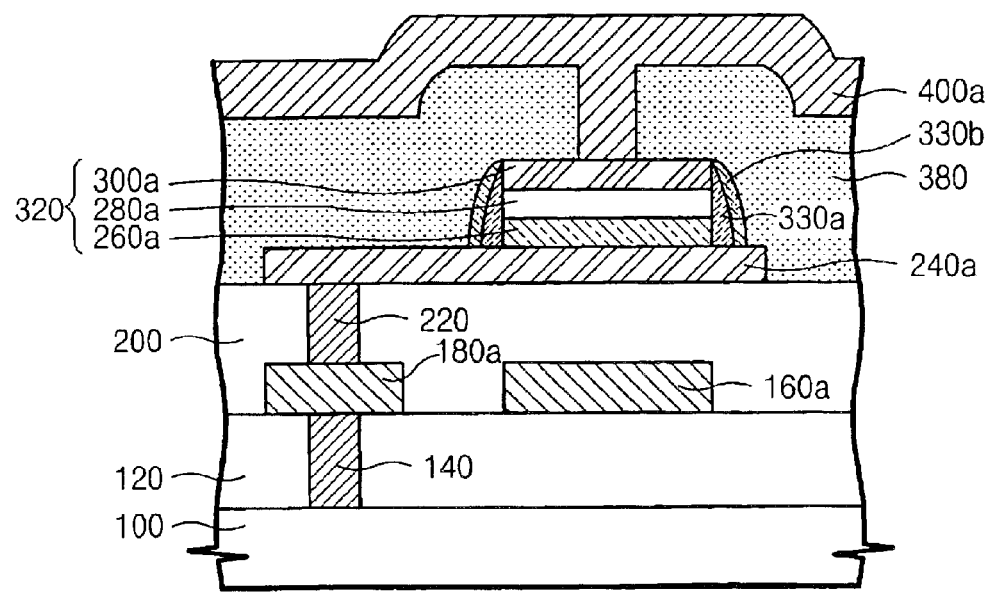

Referring to FIG. 7F, an interlayer dielectric layer 380 and a bit line 400a are formed by processes identical to those explained above.

Specific embodiments of the invention will now be described in a non-limiting way. The magnetoresistive memory device according to embodiments of the invention includes magnetic focusing spacers on sidewalls of the magnetoresistive memory cell, so that magnetic fields generated by the bit line and the digit line are efficiently transferred to the magnetoresistive memory cell. As a result, the device exhibits low power dissipation.

In addition, an interlayer dielectric layer insulating the magnetoresistive memory cell is formed of magnetic material with high permeability, thereby more efficiently transferring magnetic field than other magnetic memory cells.

In one embodiment, a magnetoresistive memory device includes an interlayer dielectric layer with a high permeability magnetic material layer for insulating the magnetoresistive memory cell. The interlayer dielectric layer may be made of a single layer of high permeability magnetic material or layers of high permeability magnetic material and silicon oxide.

In addition, magnetic focusing spacers may be formed on the sidewalls of the magnetoresistive memory cell. In this case, the interlayer dielectric layer surrounding the interlayer dielectric layer may be formed of silicon oxide. When no magnetic focusing spacers are present, the interlayer dielectric layer may be formed of a single layer of high permeability magnetic material or a multi-layer of high permeability magnetic material and silicon oxide.

Among the ferromagnetic layers composing the magnetoresistive memory cell, magnetic focusing spacers may be formed only on sidewalls of the ferromagnetic layers that vary their magnetization direction depending on the magnetic field.

More specifically, the magnetoresistive memory device according to some embodiments of the invention includes a conductive pattern disposed over a substrate with a dielectric layer interposed therebetween, a magnetoresistive memory cell disposed on the conductive pattern, and an interlayer dielectric layer of high permeability disposed on the insulation layer to surround the magnetoresistive memory cell.

The interlayer insulating layer of high permeability may be formed of, for example, Ni—Zn-Ferrite, Mn—Zn-Ferrite, MnFeO, CuFeO, FeO, NiFeO, or a combination thereof.

The magnetoresistive memory device may also include magnetic focusing spacers disposed on sidewalls of the magnetoresistive memory cell. In this case, the magnetic focusing spacers are formed of high permeability magnetic material including Ni—Zn-Ferrite, Mn—Zn-Ferrite, MnFeO, CuFeO, FeO, NiFeO, or a combination thereof. Embodiments of the invention may further include conductive magnetic focusing spacers formed of Co, NiFe, or a combination thereof on the magnetic focusing spacers.

The magnetoresistive memory cell includes a lower ferromagnetic layer pattern, a nonmagnetic layer pattern, and an upper ferromagnetic layer pattern that are sequentially stacked on the conductive pattern. The magnetic focusing spacers may be formed on sidewalls of the upper ferromagnetic layer pattern. In this case, the magnetic focusing spacers are made of a metallic magnetic material including Co and NiFe or a high permeability magnetic material including Ni—Fe-Ferrite, Mn—Zn-Ferrite, MnFeO, CuFeO, FeO, NiFeO, and the like.

The magnetoresistive memory device further includes a bit line penetrating the interlayer dielectric layer to electrically connect with the upper ferromagnetic layer pattern, a digit line disposed in the insulation layer to place the upper ferromagnetic layer pattern in a region where the bit line crosses over the digit line, and a contact pad at a height identical with the digit line that electrically connects the lower ferromagnetic layer pattern to an active region of the substrate.

The bit line and the digit line provide magnetic fields to the magnetoresistive memory cell. The bit line, in addition, supplies a sense current to the magnetoresistive memory cell.

The conductive pattern, the lower ferromagnetic layer pattern, and the nonmagnetic layer pattern are positioned over the contact pad and the digit line, while the upper ferromagnetic layer pattern is positioned over the digit line.

In other embodiments of the invention, the magnetoresistive memory device further includes a bit line penetrating the interlayer dielectric layer to electrically connect the upper ferromagnetic layer pattern, a digit line disposed in the insulation layer to place the upper ferromagnetic layer pattern in a region where the bit line crosses over the digit line, and a contact pad at a height identical with the digit line that connects the lower ferromagnetic layer pattern to an active region of the substrate. In this case, the conductive pattern covers the contact pad and the digit line, while the lower ferromagnetic layer pattern, the nonmagnetic layer pattern, and the upper ferromagnetic layer pattern cover the digit line.

A magnetoresistive memory device according to other embodiments of the invention includes a conductive pattern disposed over a substrate with an insulation layer interposed therebetween, a magnetoresistive memory cell disposed on the conductive pattern, magnetic focusing spacers disposed on sidewalls of the magnetoresistive memory cell, and an interlayer dielectric layer disposed on the insulation layer to surround the magnetoresistive memory cell.

In one embodiment, the magnetic focusing spacers are made of a high permeability magnetic material including, for example, Ni—Zn-Ferrite, Mn—Zn-Ferrite, MnFeO, CuFeO, FeO, and NiFeO). The interlayer dielectric layer is a silicon oxide layer, a high permeability magnetic layer, or a combination layer of silicon oxide and high permeability magnetic material.

According to embodiments of the invention, a method of fabricating the magnetoresistive memory device includes forming a conductive pattern over a substrate with an insulation layer interposed therebetween, sequentially forming a lower ferromagnetic layer, a nonmagnetic layer, and an upper ferromagnetic layer on the conductive pattern and the insulation layer, patterning the upper ferromagnetic layer, the nonmagnetic layer, and the lower magnetic layer to form a magnetoresistive memory cell including an upper ferromagnetic layer pattern, a nonmagnetic layer pattern, and a lower magnetic layer pattern, forming magnetic focusing spacers on sidewalls of the magnetoresistive memory cell, and forming an interlayer dielectric layer on an entire surface of a resultant structure with the magnetic focusing spacers.

In the above method, the magnetic focusing spacers and the high permeability magnetic material layer are formed of Ni—Zn-Ferrite, Mn—Zn-Ferrite, MnFeO, CuFeO, FeO, NiFeO, or a combination thereof.

The above method further includes a process of forming conductive magnetic focusing spacers on the magnetic focusing spacers. The conductive magnetic focusing spacers are formed of Co, NiFe, or a combination thereof.

In the above method, forming the magnetoresistive memory cell includes patterning the upper ferromagnetic layer to form the upper ferromagnetic layer pattern and successively patterning the nonmagnetic layer and the lower ferromagnetic layer to form the nonmagnetic layer pattern and the lower magnetic layer pattern, both of which are wider than the upper ferromagnetic layer pattern.

Forming the magnetic focusing spacers includes forming a spacer material layer on the insulation layer and the magnetoresistive memory cell and etching the spacer material layer to form spacers on sidewalls of the upper ferromagnetic layer pattern. The magnetic focusing spacers are formed of Co, NiFe, Ni—Zn-Ferrite, Mn—Zn-Ferrite, MnFeO, CuFeO, FeO, NiFeO, or a combination thereof.

According to other embodiments of the invention, a method of fabricating a magnetoresistive memory device includes sequentially forming a conductive layer, a lower ferromagnetic layer, a nonmagnetic layer, and an upper magnetic layer over a substrate with an insulation layer interposed therebetween. The method also includes successively patterning the stacked layers to form an upper ferromagnetic layer pattern, a nonmagnetic layer pattern, a lower magnetic layer pattern, and a conductive layer pattern, wherein the upper ferromagnetic layer pattern, the nonmagnetic layer pattern, and the lower ferromagnetic layer pattern compose a magnetoresistive memory cell. Additionally, the method includes forming magnetic focusing spacers on sidewalls of the magnetoresistive memory cell and forming an interlayer dielectric layer on an entire surface of the resultant structure.

In the above method, the nonmagnetic layer pattern, the lower ferromagnetic layer pattern, and the conductive layer pattern are formed to be wider than the upper ferromagnetic layer pattern.

The step of forming the magnetic focusing spacers includes forming a spacer material layer on the insulation layer and the magnetoresistive memory cell and then etching the spacer material layer to form the magnetic focusing spacers on sidewalls of the upper ferromagnetic layer pattern. The magnetic focusing spacers are formed of Co, NiFe, Ni—Zn-Ferrite, Mn—Zn-Ferrite, MnFeO, CuFeO, FeO, NiFeO, or a combination thereof.

While the invention has been described in connection with specific and preferred embodiments thereof, it is capable of various changes and modifications without departing from the spirit and scope of the invention. It should be appreciated that the scope of the invention is not limited to the detailed description of the invention hereinabove, which is intended merely to be illustrative, but rather comprehends the subject matter defined by the following claims.

What is claimed is:

1. A magnetaresistive memory device comprising:
a conductive pattern disposed over a substrate with an insulation layer interposed therebetween;
a magnetoresistive memory cell disposed on the conductive pattern; and
an interlayer dielectric layer disposed on the insulation layer to cover sidewalls and a top surface of the magnetoresistive memory cell, wherein the interlayer dielectric layer comprises a high permeability magnetic material layer and a silicon oxide layer.

2. The magnetoresistive memory device of claim 1, further comprising magnetic focusing spacers disposed on sidewalls of the magnetoresistive memory cell.

3. The magnetoresistive memory device of claim 2, wherein the magnetic focusing spacers and the high permeability magnetic layer are formed of a material chosen from the group consisting of Ni—Zn-Ferrite, Mn—Zn-Ferrite, MnFeO, CuFeO, FeO, NiFeO, and combinations thereof.

4. The magnetoresistive memory device of claim 2, further comprising magnetic focusing conductive spacers disposed on the magnetic focusing spacers.

5. The magnetoresistive memory device of claim 4, wherein the magnetic focusing conductive spacers arc formed of a material chosen from the group consisting of Co, NiFe, and combinations thereof.

6. The magnetoresistive memory device of claim 1, wherein the high permeability magnetic material layer is formed of material chosen from the group consisting of Ni—Zn-Ferrite, Mn—Zn-Ferrite, MnFeO, CuFeO, FeO, NiFeO, and combinations thereof.

7. The magnetoresistive memory device of claim 1, wherein the magnetoresistive memory cell comprises a lower feffomagnetic layer pattern, a nonmagnetic layer pattern, and an upper ferromagnetic layer pattern that are sequentially stacked on the conductive pattern.

8. The magnetoresistive memory device of claim 7, further comprising magnetic focusing spacers disposed on sidewalls of the upper ferromagnetic layer pattern.

9. The magnetoresistive memory device of claim 8, wherein the magnetic focusing spacers are formed of a material chosen from the group consisting of Co, NiFe, Ni—Zn-Ferrite, Mn—Zn-Ferrite, MnFeO, CuFeO, FeO, NiFeO, and a combination thereof, and
wherein the high permeability magnetic material layer is chosen from the group consisting of Ni—Fe-Ferrite, Mn—Zn-Ferrite, MnFeO, CuFeO, FeO, NiFeO, and a combination thereof.

10. The magnetoresistive memory device of claim 9, further comprising:
a bit line electrically connected to the upper ferromagnetic layer pattern;
a digit line disposed in the insulation layer such that the upper ferromagnetic layer pattern is in a region where the bit line crosses over the digit line; and
a contact pad positioned in the insulating layer at a height approximately equal to that of the digit line, the contact pad electrically connecting the lower ferromagnetic layer pattern and an active region of the substrate through a lower contact plug and an upper contact plug that penetrate the insulating layer under and over the contact pad.

11. The magnetoresistive memory device of claim 10, wherein the conductive pattern, the lower ferromagnetic layer pattern, and the nonmagnetic layer pattern are positioned over the contact pad and the digit line, and
wherein the upper ferromagnetic layer pattern is positioned over the digit line.

12. The magnetoresistive memory device of claim 3, wherein the magnetoresistive memory cell comprises a lower ferromagnetic layer pattern, a nonmagnetic layer pattern, and an upper ferromagnetic layer pattern that are sequentially stacked on the conductive patterns and wherein the magnetoresistive memory device further comprises:
a bit line electrically connected to the upper ferromagnetic layer pattern;
a digit line positioned in the insulation layer such that the upper ferromagnetic layer pattern is in a region where the bit line crosses over the digit line; and
a contact pad positioned in the insulating layer at a height approximately equal with the digit line, the contact pad connecting the lower ferromagnetic layer pattern and an active region of the substrate through a lower contact plug and an upper contact plug that penetrate the insulating layer under and over the contact pad.

13. The magnetoresistive memory device of claim 12, wherein the conductive pattern is positioned over the contact pad and the digit line, and wherein the lower ferromagnetic layer pattern, the nonmagnetic layer pattern, and the upper ferromagnetic layer pattern are positioned over the digit line.

14. A magnetoresistive memory device comprising:

a conductive pattern positioned over a substrate with an insulation layer interposed therebetween;

a magnetoresistive memory cell positioned on the conductive pattern, magnetic focusing spacers disposed on sidewalls of the magnetoresistive memory cell; and an interlayer dielectric layer positioned on the insulation layer and surrounding the magnetoresistive memory cell.

15. The magnetoresistive memory device of claim 14, wherein the magnetic focusing spacers are made of a material chosen from the group consisting of Ni—Zn-Ferrite, Mn—Zn-Ferrite, MnFeO, CuFeO, FeO, NiFeO, and combinations thereof.

16. The magnetoresistive memory device of claim 14, wherein the interlayer dielectric layer comprises a layer formed of a material chosen from the group consisting of Ni—Zn-Ferrite, Mn—Zn-Ferrite, MnFeO, CuFeO, FeO, NiFeO, and combinations thereof.

17. The magnetoresistive memory device of claim 16, wherein the interlayer dielectric layer further comprises a silicon oxide layer.

18. The magnetoresistive memory device of claim 14, wherein the magnetoresistive memory cell comprises a lower ferromagnetic layer pattern, a nonmagnetic layer pattern, and an upper ferromagnetic layer pattern that are sequentially stacked on the conductive pattern, and wherein the magnetic focusing spacers are disposed on sidewalls of the upper ferromagnetic layer pattern.

19. The magnetoresistive memory device of claim 14, wherein the magnetic focusing spacers are formed of a material chosen from the group consisting of Co, NiFe, Ni—Zn-Ferrite, Mn—Zn-Ferrite, MnFeO, CuFeO, FeO, NiFeO, and combinations thereof.

* * * * *

UNITED STATES PATENT AND TRADEMARK OFFICE
CERTIFICATE OF CORRECTION

PATENT NO.        : 6,927,467 B2
APPLICATION NO. : 10/636027
DATED             : August 9, 2005
INVENTOR(S)       : Kim It is certified that error appears in the above-identified patent and that said Letters Patent is hereby corrected as shown below:

At column 9, line 52, please replace "magnetaresistive" with --magnetoresistive--

At column 10, line 17, please replace "feffomagnetic" with --ferromagnetic--

At column 10, line 57, please replace "patterns" with --pattern,--

At column 11, line 14, please replace "pattern," with --pattern;--

Signed and Sealed this

Twelfth Day of September, 2006

JON W. DUDAS
*Director of the United States Patent and Trademark Office*